United States Patent [19]

Suzuki

[11] 4,037,169

[45] July 19, 1977

[54] TRANSISTOR AMPLIFIER

[75] Inventor: Tadao Suzuki, Tokyo, Japan

[73] Assignee: Sony Corporation, Tokyo, Japan

[21] Appl. No.: 579,043

[22] Filed: May 20, 1975

[30] Foreign Application Priority Data

May 21, 1974  Japan ............................ 49-57645[U]

[51] Int. Cl.² ............................................. H03F 3/16
[52] U.S. Cl. ........................................ 330/35; 330/22
[58] Field of Search ..................... 330/35, 142; 357/22

[56] References Cited

U.S. PATENT DOCUMENTS

| 3,176,192 | 3/1965 | Sueur et al. | 330/35 X |
|---|---|---|---|
| 3,424,994 | 1/1969 | Browder | 330/142 |
| 3,761,832 | 9/1963 | Blattenberger | 330/35 X |
| 3,767,982 | 10/1973 | Teszner et al. | 357/22 X |
| 3,814,995 | 6/1974 | Teszner | 357/22 |

*Primary Examiner*—Rudolph V. Rolinec
*Assistant Examiner*—Lawrence J. Dahl
*Attorney, Agent, or Firm*—Lewis H. Eslinger; Alvin Sinderbrand

[57] ABSTRACT

A low-noise, small-signal transistor amplifier particularly suited for use as a preamplifier in an acoustic or audio apparatus employs a field effect transistor having triode-type characteristics in a common source type amplification circuit, with the gate of the field effect transistor being connected directly to an input terminal which receives the audio signals to be amplified, the drain of the field effect transistor being connected to an output terminal, preferably through a capacitor for DC cutting, and the source of the field effect transistor being connected to a point of reference potential, such as the ground, through a parallel circuit of a resistor and a capacitor.

5 Claims, 5 Drawing Figures

TRANSISTOR AMPLIFIER

BACKGROUND OF THE INVENTION

1. Field of the Invention

This invention relates to a transistor amplifier, and more particularly to a low-noise, small-signal amplifier which can be effective used as a preamplifier for an acoustic or audio apparatus.

2. Description of the Prior Art

A low-noise, small-signal amplifier is known in which two bipolar transistors are connected in series between input and output terminals so that a small signal supplied to the input terminal is suitably amplified prior to delivery at the output terminal. In order to improve the distortion factor to such amplifier and to increase the input impedance and reduce the output impedance, a series-at-input and parallel-at-output type signal feedback circuit is provided. Further, in order to improve the bias stability of the bipolar transistors, a DC feedback circuit is provided. In order to avoid an adverse effect from the impulsive external noise signal, a time constant characteristic is provided at the input side of the first stage bipolar transistor.

The foregoing known amplifier is disadvantageous in that it obviously requires a large number of circuit elements and hence its adjustment is relatively difficult to achieve. Further, even if the bipolar transistors are of a low-noise type, the thermal agitation noise of the resistors which constitute the above described series-at-input and parallel-at-output feedback circuit restricts the noise figure level that is attainable in the event of short circuitry on the input side of the amplifier.

OBJECTS AND SUMMARY OF THE INVENTION

Accordingly, it is an object of this invention to provide a low-noise, small-signal transistor amplifier which is free of the abovementioned defects inherent in the described prior art amplifier of that type.

More specifically, it is an object of this invention to provide a transistor amplifier, as aforesaid, in which the amplifying element is constituted by a field effect transistor having triode-type characteristics so as to improve the input and output impedance characteristics as well as the distortion factor of the amplifier without the necessity of providing the latter with any signal feedback circuit for those purpose.

Another object is to provide a transistor amplifier, as aforesaid, in which the gate of the field effect transistor having triode-type characteristics is connected directly to the input terminal which receives the signal to be amplified so as to avoid the need for any time constant circuit for eliminating impulsive external noise, with the result that the noise figure of the amplifier is markedly improved.

Still another object is to provide a transistor amplifier, as aforesaid, in which, since the gate of the field effect transistor having triode-type characteristics is directly connected to the input terminal or signal source and also because no resistance is provided that may become a noise source upon shortcircuiting on the input side, the noise figure of the entire amplifier upon such shortcircuiting on the input side is improved to the level of the noise figure of the field effect transistor acting as an amplifying element.

A further object is to provide a transistor amplifier, as aforesaid, in which a single field effect transistor serves as the amplifying element in a common source type amplification circuit so as to avoid the necessity of providing a circuit for connecting a plurality of amplifying elements and further to achieve excellent phase characteristics.

In accordance with an aspect of this invention, a low-noise, small-signal transistor amplifier, for example, for use as a preamplifier in an acoustic or audio apparatus, comprises a field effect transistor having triode-type characteristics and preferably constituting the sole amplifying element in a common source type amplification circuit, with the gate of the field effect transistor being connected directly to the input terminal receiving the signal to be amplified, the drain of the field effect transistor being connected to the output terminal of the amplifier, preferably through a capacitor for DC cutting, and the source of the field effect transistor being connected to a point of reference potential, such as the ground, through a parallel circuit of a resistor and capacitor.

The above, and other objects, features and advantages of the present invention, will become apparent from the following detailed description of preferred embodiments thereof which is to be read in conjunction with the accompanying drawings.

DESCRIPTION OF PREFERRED EMBODIMENTS

Before proceeding with the detailed description of the present invention, reference will be made to FIG. 1 which shows a well-known type of low-noise small-signal amplifier in which, as shown, two bipolar transistors Q1 and Q2 are connected in series between the input terminal 1 and the output terminal 2 so that the small signal fed into the circuit at input terminal 1 is derived at output terminal 2 after having been amplified to a required extent. In the illustrated circuit, a resistor R1 is connected to the emitter of transistor Q1 and a resistor R2 is connected between the collector of transistor Q2 and the emitter of transistor Q1 to constitute a series-at-input and parallel-at-output type signal feedback circuit for improving the distortion factor and increasing the input impedance while reducing the output impedance. Further, DC feedback is effected from the emitter of transistor Q2 of the latter or second stage to the base of transistor Q1 of the preceding stage through a resistor R3 which is connected to the input terminal 1 and to the emitter of transistor Q2, and a resistor R4 connected to the emitter of transistor Q2, thereby to improve bias stability of both transistors Q1 and Q2. In order to avoid any adverse effect from an impulsive external noise signal, a time constant characteristic is provided to the input side of transistor Q1 of the first preceding stage by means of a resistor R5 and a capacitor C1.

Figure 1:
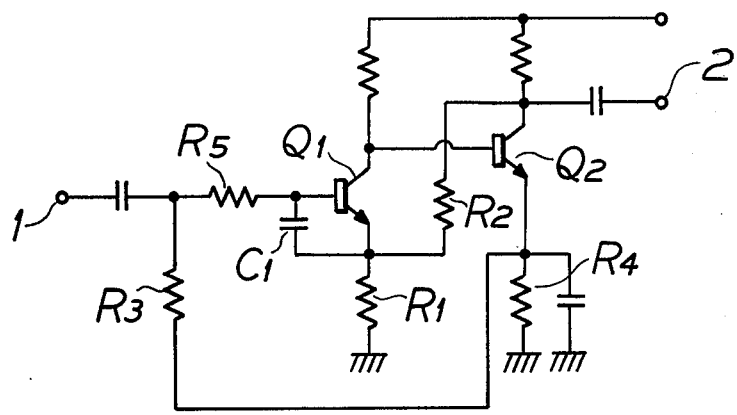
FIG. 1 is a circuit diagram of a prior art transistor amplifier.

However, an amplifier of the type shown in FIG. 1 is basically subject to restriction in the scope of the increase of its noise figure. That is, the noise figure level, upon shortcuiting on the input side, is restricted by thermal agitation noise of resistances R1 and R2 even if low-noise transistors are used for transistors Q1 and Q2. Further, it will be apparent that the known amplifier of FIG. 1 comprises a relatively large number of circuit elements, and hence, in most cases, the assembly and adjustment of its parts is complicated and difficult to achieve.

Figure 2:
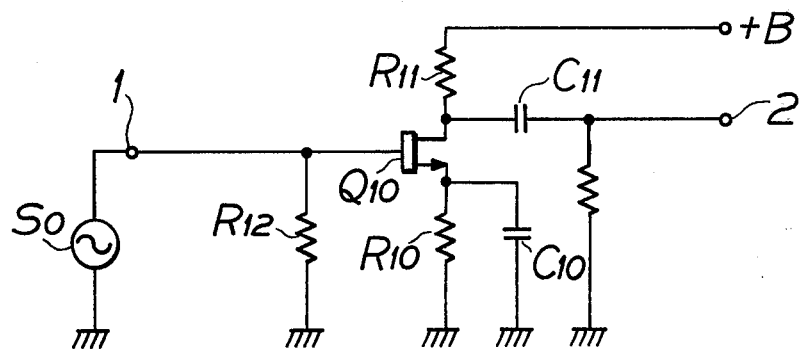
FIG. 2 is a circuit diagram of a transistor amplifier according to the present invention.

Referring now to FIG. 2, it will be seen that a transistor amplifier according to the present invention for avoiding the above problems simply comprises a field effect transistor Q10, hereinafter sometimes referred to as an FET, which has triode type characteristics, and which is connected as an amplifying element between the input terminal 1 receiving the signal to be amplified from a source So and the output terminal 2.

Figure 3:
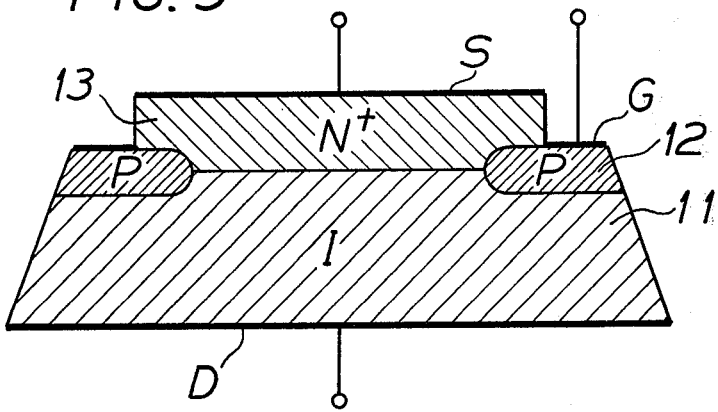
FIG. 3 is a schematic sectional view showing one of the types of field effect transistors which is to be used in the amplifier according to the present invention.

As shown in FIG. 3, the FET Q10 with triode characteristics for use in the transistor amplifier according to this invention may include an intrinsic semiconductor region 11 of low impurity concentration and high resistance which has thereon an annular P-type semiconductor region 12 formed by a selective diffusion method or the like. An N-type semiconductor region 13 of high impurity concentration spreading over the intrinsic semiconductor region 11 and the P-type semiconductor region 12 is formed by an epitaxial method or the like. A drain electrode D is provided at the bottom of intrinsic semiconductor region 11, a gate electrode G is provided on P-type semiconductor region 12, and a source electrode S is provided on the upper surface of N-type semiconductor region 13.

Figure 4:
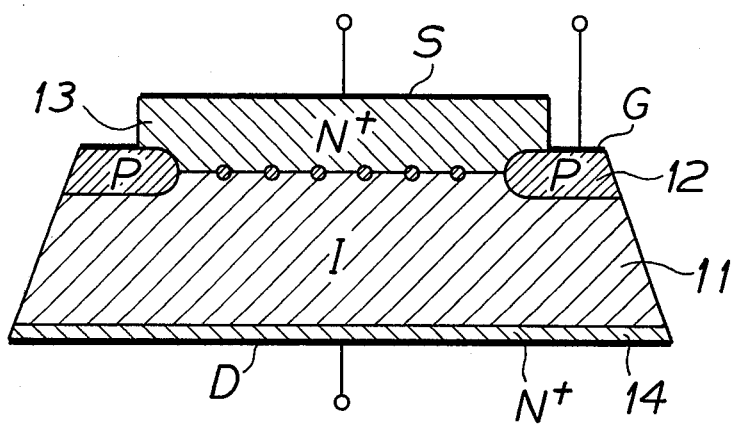
FIG. 4 is a schematic sectional view showing another of the types of field effect transistors employable in the amplifier according to the present invention.

Referring now to FIG. 4, in which elements corresponding to those described above with reference to FIG. 3 are identified by the same reference numerals, it will be seen that, in a preferred type of field effect transistor with triode characteristics suitable for use in transistor amplifiers according to this invention, the P-type semiconductor region 12 is formed in a mesh-like configuration, and an N-type semiconductor region 14 of high impurity concentration is provided under the lower surface of the intrinsic semiconductor region for increasing the breakdown voltage between the drain and source electrodes D and S.

In the field effect transistors of FIGS. 3 and 4, increasing the gate voltage (negatively) causes growth of depletion layers from the portions of gate region 12 that extend between drain region 11 and source region 13 and the channel is formed in source region 13 between such gate portions. Since source region 13 is shown to be of N-type conductivity, the field effect transistors illustrated on FIGS. 3 and 4 are N-channel transistors, however, it will be apparent that similar field effect transistors may be provided with the regions 12 and 13 thereof being of N-type and P-type conductivities, respectively, so as to be P-channel field effect transistors.

In any case, it will be apparent that each of the illustrated field effect transistors has a vertical channel, rather than a lateral channel as in a conventional field effect transistor. By reason of such vertical channel, bot the distance between the source electrode S and the channel and the length of the channel itself are very small so that the field effect transistor has a very low output resistance or impedance, for example, on the order of about ten ohms. It is a feature of field effect transistors of the type shown on FIGS. 3 and 4 that the drain current thereof does not become saturated in response to increasing of the voltage between the drain and source; whereas, in a conventional junction type field effect transistor having a lateral channel and exhibiting pentode-type characteristics, the drain current becomes saturated at a predetermined value of the drain voltage. The foregoing advantage of field effect transistors having a vertical channel will be apparent from the following equation for the apparent conversion conductance gm of a junction type field effect transistor:

$$gm = Gm/(1 + RC \cdot Gm)$$

in which Gm is the true conversion conductance and Rc is the equivalent internal resistance of the field effect transistor between its source and drain electrodes. Resistance Rc is a composite resistance comprising the resistance between the source electrode and the channel within the field effect transistor, the resistance of the channel itself and the resistance between the channel and the drain electrode. In a conventional junction type field effect transistor having a lateral channel, the resistance between the source electrode and the channel, the resistance of the channel itself and the resistance between the channel and the drain electrode are all large with the result that the resistance Rc in the above equation is very high, for example, on the order of several meg-ohms. Owing to such high value of the equivalent internal resistance Rc, the apparent conversion conductance gm is essentially equal to the reciprocal of the resistance Rc. Therefore, the existing field effect transistors with lateral channels exhibit pentode-type characteristics so that, as the voltage applied to its drain electrode increases, the drain voltage-drain current characteristics of such transistor tend to cause saturation of the drain current at a predetermined value of the drain voltage.

As distinguished from the foregoing, in the field effect transistor with a vertical channel, both the distance between the source electrode S and the channel and the length of the channel itself are very small, as noted above, so that the resistance Rc for such field effect transistor is much smaller than the corresponding resistance in the case of a field effect transistor with a later channel, and further the true conductance Gm is relatively high for the field effect transistor with a vertical channel. In fact, in the case of a field effect transistor with a vertical channel, the product Rc·Gm in the above equation is generally less than unity. Thus, it will be apparent from the equation that, for the field effect transistor with a vertical channel employed in a transistor amplifier according to this invention, the apparent conversion conductance gm closely approximates the true conversion conductance Gm which in turn depends on the width variation of the depletion layer.

Figure 5:
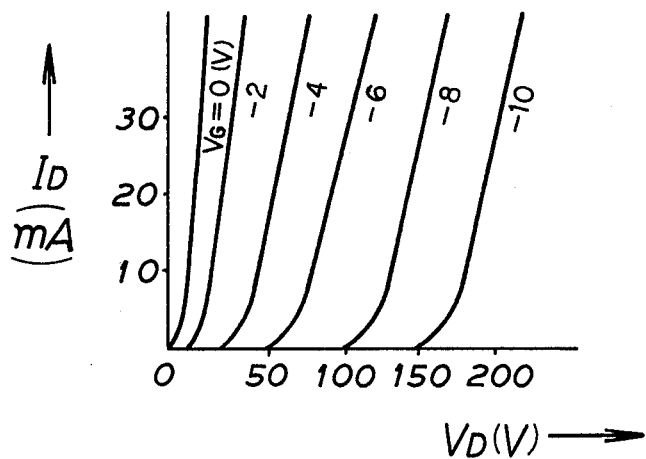
FIG. 5 is a graphic representation of the dynamic characteristics of the field effect transistor.

As shown in FIG. 5, by way of example, in which the abscissa indicates drain voltage $V_D$ in volts (V) and the ordinate indicates drain current $I_D$ in milli-ampere (mA), with gate voltage $V_G$ in volts (V) being used as a parameter, the drain voltage-drain current characteristic curves of a field effect transistor with a vertical channel, such as is shown on FIGS. 3 and 4, are similar to those of a triode so that the illustrated field effect transistors can be said to have triode characteristics. More particularly, it will be seen that the drain voltage-drain current characteristic curves of FIG. 5, being similar to those of a triode, are straight for substantial portions of their lengths with such straight portions being steeply inclined and substantially parallel, to indicate a low output impedance with the resistance Rc being substantially constant in spite of voltage variations to provide a large output of excellent linearity and relatively low distrotion.

As indicated above, the field effect transistor with a vertical channel to be employed in the transistor amplifier according to the present invention can take a small and constant value of internal resistance irrespective of the drain current $I_D$ that may vary over a wide range. The input impedance is of course high and also excellent linearity is provided in the relation between gate voltage $V_G$ and drain current $I_D$. Such field effect transistor also exhibits an extremely low internal noise in the audio frequency zone. Further, when the drain voltage $V_D$ is around 100 V, the gate voltage $V_G$ required for operation is as high as about 5 V, and hence it is not necessary to provide any specific means to cope with the impulsive external noise signal as required in bipolar transistors. All of the foregoing is generally true in respect to any field effect transistors with triode type characteristics.

Referring again to FIG. 2, it will be seen that, in the transistor amplifier according to this invention, the gate electrode G of field effect transistor Q10 is connected directly to the input terminal 1 and the source electrode S is connected to the ground, which is a point of reference potential, through a parallel circuit of a resistor R10 and a capacitor C10. The drain electrode D is connected to a power source +B, which provides DC operating voltage, through a resistor R11 and to the output terminal 2 through a capacitor C11 for DC cutting. The foregoing connections for the FET constitute a common source type amplification circuit. The gate electrode of the field effect transistor Q10 is grounded through a resistor R12 which has a high resistance value so that the FET is provided with a so-called self-bias by the voltage drop of resistor R10.

It will be apparent that, in the transistor amplifier according to this invention as shown on FIG. 2, the signal from the signal source So is fed to the gate of FET Q10 directly from the input terminal 1 and, after being suitably amplified thereby, emerges from the output terminal 2 through capacitor C11. As the FET Q10, which acts as the amplifying element, has the above-described characteristics, it is possible to provide satisfactory input and output impedance characteristics and distortion factor without resorting to any signal feedback. Since no signal feedback is provided, the gain of the common source type amplification circuit using the FET Q10 with triode type characteristics is within the range of approximately 20 to 30 α B which is determined by the voltage amplification factor $\mu$ of said FET, and a gain within this range is also suited for operation of a low-noise, small-signal amplifier. Further, as the gate-source voltage is as high as about 5 V, no problem is caused by the external noise signal even if means, for example, corresponding to resistor R5 and capacitor C1 in FIG. 1, are not provided.

Thus, the transistor amplifier according to the present invention is very simple in its circuit arrangement and yet can satisfy the requirements as to input and output impedance characteristics, non-linear distortion characteristics, gain and external noise characteristics which are required of a low-noise small-signal amplifier. The noise figure of the amplifier itself is also improved as the noise of the source resistor R10 is bypassed by means of the capacitor C10.

Although the invention has been shown applied to a transistor amplifier with a single field effect transistor in the circuit of FIG. 2, it will be understood that transistor amplifiers according to the invention may also comprise two or more of such circuits which are suitably combined.

Having described specific embodiments of the invention with reference to the accompanying drawings, it is to be understood that the invention is not limited to those precise embodiments, and that variations and changes may be effected therein by one skilled in the art without departing from the scope or spirit of the invention as defined in the appended claims.

What is claimed is:

1. A transistor amplifier comprising an input terminal for receiving audio signals to be amplified, an output terminal for delivering the amplified audio signals, a field effect transistor for amplifying said audio signals and including gate, source and drain electrodes, an intrinsic semiconductor region in said field effect transistor to which one of said electrodes is connected so that a vertical channel is formed in said field effect transistor whereby its drain current does not become saturated when its drain voltage is increased so as to exhibit triode-type characteristics, means defining a reference potential, a resistor and capacitor connected in a parallel circuit between said source electrode and said reference potential, means connecting said gate electrode directly to said input terminal, and means connecting said drain electrode to said output terminal.

2. A transistor amplifier according to claim 1; further comprising a resistor connected between said gate electrode and said reference potential, means defining a DC source of operating voltage, and a resistor connected between said DC source and said drain electrode.

3. A transistor amplifier according to claim 1; in which said intrinsic semiconductor region is of low impurity concentration and high resistance, and wherein a semiconductor region of one type of conductivity extends over a portion of said intrinsic semiconductor region, and a semiconductor region of the opposite type of conductivity and high impurity concentration extends over said semiconductor region of said one type of conductivity and over the balance of said intrinsic semiconductor region; and in which said drain electrode is provided on said intrinsic semiconductor region, said gate electrode is provided on said semiconductor region of said one type of conductivity, and said source electrode is provided on said semiconductor region of said opposite type of conductivity.

4. A transistor amplifier according to claim 3; in which said semiconductor region of said one type of conductivity is of mesh-like configuration, and said intrinsic semiconductor region has a layer of semiconductor material of said opposite type of conductivity with a high impurity concentration at the surface of said intrinsic region on which said drain electrode is provided.

5. A transistor amplifier according to claim 1; in which said field effect transistor constitutes the sole amplifying element in a common source type amplification circuit.

* * * * *